United States Patent
Yamamoto et al.

(10) Patent No.: US 7,020,173 B2
(45) Date of Patent: Mar. 28, 2006

(54) SURFACE EMITTING SEMICONDUCTOR LASER AND METHOD OF FABRICATING THE SAME

(75) Inventors: Masateru Yamamoto, Kanagawa (JP); Jun Sakurai, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 183 days.

(21) Appl. No.: 10/625,687

(22) Filed: Jul. 24, 2003

(65) Prior Publication Data

US 2004/0151221 A1    Aug. 5, 2004

(30) Foreign Application Priority Data

Dec. 16, 2002   (JP)   .............................. 2002-363486

(51) Int. Cl.
*H01S 5/00*   (2006.01)
(52) U.S. Cl. ................. 372/45.01; 372/46.01
(58) Field of Classification Search ............ 372/43–50, 372/97, 75
See application file for complete search history.

(56) References Cited

U.S. PATENT DOCUMENTS

| | | | | |
|---|---|---|---|---|
| 5,351,257 A | * | 9/1994 | Lebby et al. ................. 372/46 |
| 6,144,682 A | * | 11/2000 | Sun ............................... 372/45 |
| 6,185,241 B1 | * | 2/2001 | Sun ............................... 372/96 |
| 6,201,825 B1 | * | 3/2001 | Sakurai et al. ................ 372/96 |
| 6,529,541 B1 | * | 3/2003 | Ueki et al. .................... 372/96 |
| 6,717,974 B1 | * | 4/2004 | Zhang .......................... 372/96 |

FOREIGN PATENT DOCUMENTS

JP    A 11-340565    * 12/1999

* cited by examiner

*Primary Examiner*—Minsun Oh Harvey
*Assistant Examiner*—Tuan N. Nguyen
(74) *Attorney, Agent, or Firm*—Oliff & Berridge, PLC (57) ABSTRACT

A surface emitting semiconductor laser includes a substrate, a first mirror that is formed on the substrate and includes semiconductor layers of a first conduction type, a second mirror that includes semiconductor layers of a second conduction type, an active region disposed between the first and second mirrors, a current confinement layer that is disposed between the first and second mirrors and includes a selectively oxidized region, and an inorganic insulation film. A mesa structure includes at least the second mirror and the current confinement layer. The inorganic insulation film covers at least a side surface of the mesa structure and having an internal stress equal to or less than $1.5 \times 10^9$ dyne/cm$^2$.

33 Claims, 7 Drawing Sheets

SURFACE EMITTING SEMICONDUCTOR LASER AND METHOD OF FABRICATING THE SAME

BACKGROUND OF THE INVENTION

1. Field of the Invention

The present invention relates to a surface emitting semiconductor laser and a method of fabricating the same, and more particularly, to a selective oxidization type surface emitting semiconductor laser and a method of fabricating the same.

2. Description of the Related Art

Recently, there has been an increased demand for a surface emitting semiconductor laser that has advantages of easy arrangement of a two-dimensional array of sources and low threshold current and low power consumption. These advantages are attractive in the technical fields of optical communications and optical recording. Such a surface emitting semiconductor laser is also called a vertical-cavity surface-emitting laser (VCSEL).

The inventors of the present invention have proposed an improved surface emitting semiconductor laser that has a lengthened lifetime and even output power in Japanese Laid-Open Patent Application Publication No. 11-340565. The proposed laser device has a selective oxidation type of surface emitting laser having a mesa structure. An inorganic insulation film (interlayer insulation film), which may, for example, be silicon oxide, silicon oxynitride or silicon nitride, covers the edge portion of the top surface of the mesa structure and the side surface thereof. This prevents the mesa structure from caving in and lengthens the lifetime of the laser device.

However, the inventors found that the following problems still remain in the device structure disclosed in the above-mentioned application. As described in the application, the inorganic insulation film (interlayer insulating film) that covers the top and side surfaces of the mesa structure is formed by plasma-assisted chemical vapor deposition (PCVD). The inorganic insulation film may be grown to approximately 800 nm under the following condition. The substrate temperature is set at about 250° C., and the RF power is set at 100 W. A pressure of 26.6 Pa is applied, while $SiH_4$ (monosilane) of 35 ccm and ammonia of 200 ccm are supplied as a source gas. Internal stress in the silicon nitride grown under the above condition measured by utilizing the Newton's rings method is equal to or greater than $3 \times 10^9$ $dyne/cm^2$. The internal stress exerted on an oxidation control layer (current confinement layer) and an active region of the mesa structure. In case where a magnitude of internal stress greater than a certain level is exerted on the inorganic insulation film or large strain is caused therein, the oxidation control film and/or the active region may be degraded or the strength thereof may be weakened in a short period of time. This may cause the mesa structure from caving in, or may raise the interlayer insulation film and a metal interconnection line formed thereon from the substrate. This may lead to breaking of wire. These problems may shorten the lifetime of the semiconductor laser.

SUMMARY OF THE INVENTION

The present invention has been made in view of the above circumstances and provides a surface emitting semiconductor laser and a method of fabricating the same.

More specifically, the present invention provides a surface emitting semiconductor laser comprising: a substrate; a first mirror that is formed on the substrate and includes semiconductor layers of a first conduction type; a second mirror that includes semiconductor layers of a second conduction type; an active region disposed between the first and second mirrors; a current confinement layer that is disposed between the first and second mirrors and includes a selectively oxidized region; and an inorganic insulation film, a mesa structure including at least the second mirror and the current confinement layer, the inorganic insulation film covering at least a side surface of the mesa structure and having an internal stress equal to or less than $1.5 \times 10^9$ $dyne/cm^2$.

According to another aspect of the invention, there is provided a surface emitting semiconductor laser comprising: a substrate; a first semiconductor laminate of distributed a feedback type formed on a first main surface of the substrate, the first semiconductor laminate having a first conduction type; an active region formed on the first semiconductor laminate; a second semiconductor laminate of distributed feedback type formed on the active region, the second semiconductor laminate having a second conduction type; a current control layer that includes at least one $Al_xGa_{1-x}As$ ($0.9 \leq x \leq 1$) having a partially oxidized region and is interposed between the first and second semiconductor laminates; and an inorganic insulation film, a mesa structure ranging at least from an upper portion of the second semiconductor multilayer to the current control layer, the inorganic insulation film covering at least an upper surface and side surface of the mesa structure and having an internal stress equal to or less than $1.5 \times 10^9$ $dyne/cm^2$.

According to yet another object of the present invention, there is provided a surface emitting semiconductor laser comprising: a substrate; a first mirror including a first conduction type semiconductor layer formed on the substrate; a second mirror including a second conduction type semiconductor layer; an active region interposed between the first and second mirrors; a current confinement portion that includes a selectively oxidized region and is interposed between the first and second mirrors; and an inorganic insulation film, a mesa structure including at least the second mirror and the current confinement portion, the inorganic insulation film covering at least a side surface of the mesa structure and including a laminate of a first insulation film having tensile stress and a second insulation film having compressive stress.

According to a further aspect of the present invention, there is provided a surface emitting semiconductor laser comprising: a substrate; a first semiconductor laminate of distributed a feedback type formed on a first main surface of the substrate, the first semiconductor laminate having a first conduction type; an active region formed on the first semiconductor laminate; a second semiconductor laminate of distributed feedback type formed on the active region, the second semiconductor laminate having a second conduction type; a current control layer that includes at least one $Al_xGa_{1-x}As$ ($0.9 \leq x \leq 1$) having a partially oxidized region and is interposed between the first and second semiconductor laminates; and an inorganic insulation film, a mesa structure ranging at least from an upper portion of the second semiconductor multilayer to the current control layer, the inorganic insulation film covering at least an upper surface and side surface of the mesa structure and having a laminate of a first insulation layer having tensile stress and a second insulation film having compressive stress.

According to a still further object of the present invention, there is provided a method of fabricating a surface emitting semiconductor laser of selective oxidization type comprising the steps of: forming, on a substrate, multiple layers including first and second mirrors, a current confinement layer and an active region; forming a mesa structure ranging at least from the second mirror to the current confinement layer; oxidizing the current confinement layer from a side surface of the mesa structure; and forming an inorganic insulation film that covers at least a side surface of the mesa structure and an internal stress equal to or lower than $1.5 \times 10^9$ dyne/cm$^2$.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of embodiments of the present invention with reference to the accompanying drawings.

First Embodiment

Figure 1:
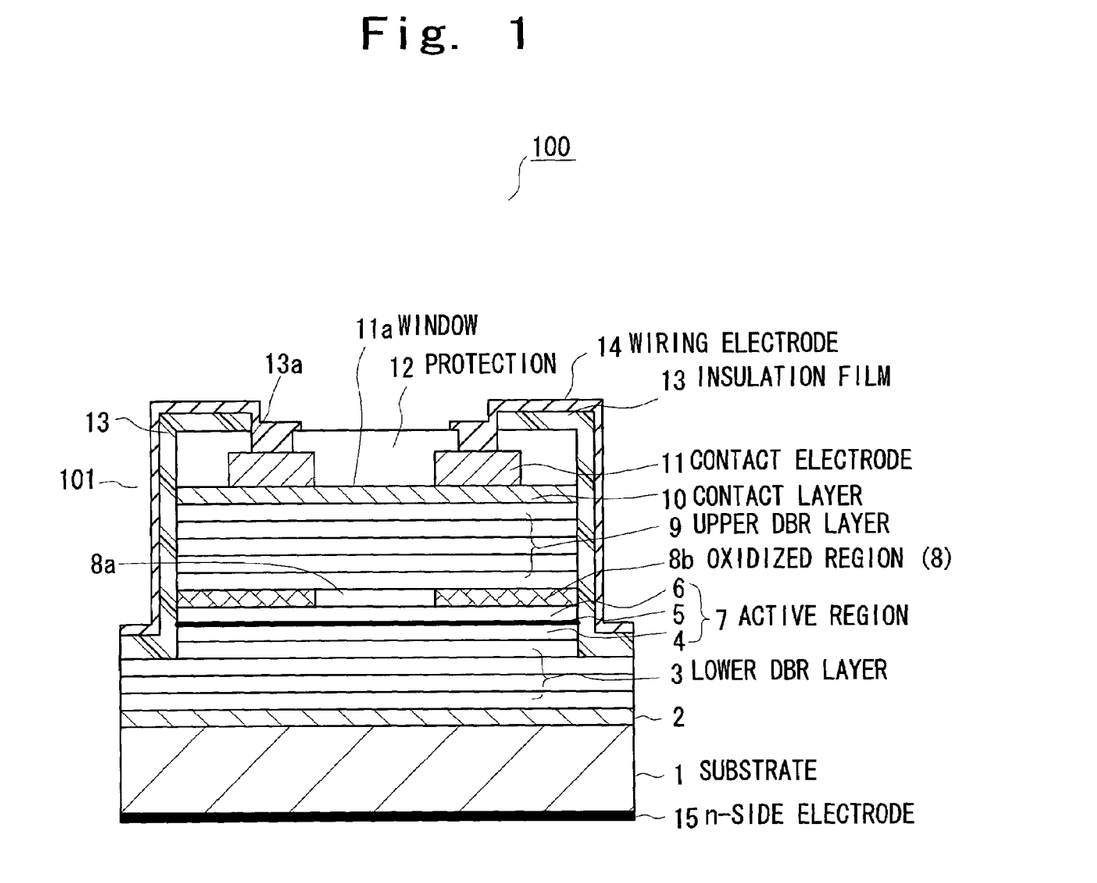
FIG. 1 is a cross-sectional view of a surface emitting semiconductor laser according to an embodiment of the present invention.

FIG. 1 is a cross-sectional view of a surface emitting semiconductor laser according to an embodiment of the present invention. Referring to FIG. 1, a surface emitting semiconductor laser 100 has a laser device part 101 having a mesa structure of a cylindrical shape. The mesa structure may be called a post structure or pillar structure. It should be noted that a protection or passivation film with which the mesa structure 101 is coated and a bonding pad extending from a metal contact layer are omitted from FIG. 1 for the sake of simplicity.

The laser 100 has an n-type GaAs substrate 1, an n-type GaAs buffer layer 2 formed on the GaAs substrate 1, an n-type lower DBR (Distributed Bragg Reflector) layer 3, and an active region 7 formed on the lower DBR layer 3. The active region 7 is a laminate of an undoped lower spacer layer 4, an undoped quantum well layer 5, and an undoped upper spacer layer 6. A current confinement layer 8, which controls current, is provided on the active region 7, and includes a p-type AlAs portion 8a and an AlAs oxide region 8b. The p-type AlAs portion 8a defines a circular optical aperture located in the center of the current confinement layer 8. The AlAs oxide region 8b surrounds the AlAs portion 8a, and confines current and light that pass through the aperture. A p-type DBR layer 9 is provided on the current confinement layer 8. A p-type contact layer 10 is formed on the upper DBR layer 9. A p-type contact electrode 11 has a ring shape and defines an outgoing light window 11a on the contact layer 10. An outgoing light window protection film 12 is formed on the contact electrode 11. An interlayer insulation film 13 covers end portions of the upper surface, the side surface and the mesa bottom of the mesa structure. A p-side wiring electrode 14 is formed on the interlayer insulation film 13 and is connected to the contact electrode 11 via a contact hole 13a formed in the interlayer insulation film 13. An n-side electrode 15 is formed on the back surface of the substrate 1. The lower DBR layer 3 and the upper DBR layer 9 serve as mirrors.

The outgoing light window 11a has a circular shape, and the center thereof substantially coincides with the optical axis that is perpendicular to the substrate 1 and passes through the center of the mesa structure 101. The center of the p-type AlAs portion 8a of the current confinement layer 8 substantially coincides with the optical axis. That is, the p-type AlAs portion 8a and the outgoing light window 11a are aligned.

The surface emitting semiconductor laser 100 according to the present invention differs from the conventional laser in that the laser 100 has reduced internal stress. Although the method of forming the interlayer insulation film 13 will be described later, the internal stress is reduced to $1.5 \times 10^9$ dyne/cm$^2$ or lower according to the present embodiment, so that the interlayer insulation film 13 can be less deformed and mechanically strengthened, this preventing the mesa structure from caving in.

A description will now be given, with reference to FIGS. 2A through 2I, of the method of fabricating the surface emitting semiconductor laser shown in FIG. 1.

A: Epitaxial Growth of Layers

Figure 2A:
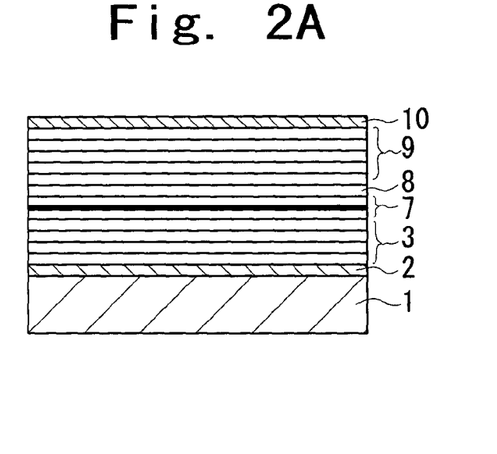
FIGS. 2A, 2B, 2C, 2D, 2E, 2F, 2G, 2H, 2I, 2J, 2K and 2L are respectively cross-sectional views illustrating a method of fabricating the surface emitting semiconductor laser shown in FIG. 1.

Multiple layers are sequentially grown on the substrate 1 by MOCVD or MBE. As shown in FIG. 2A, on the n-type GaAs substrate 1, grown are the n-type GaAs buffer layer 2, the lower DBR layer 3, the active region 7, the upper DBR layer 9 and the p-type GaAs contact layer 10 in this order. The active region 7 is composed of the undoped $Al_{0.6}Ga_{0.4}As$ lower spacer layer 4, the quantum well active layer 5, and the undoped $Al_{0.6}Ga_{0.4}As$ upper spacer layer 6. The quantum well active layer 5 is composed of undoped GaAs well and undoped $Al_{0.3}Ga_{0.7}As$ barrier layers.

The lower DBR layer 3 is composed of multiple airs of an n-type $Al_{0.9}Ga_{0.1}As$ layer and an n-type $Al_{0.15}Ga_{0.85}As$ layer. Each layer is $\lambda/4n_r$ thick where $\lambda$ is the oscillation wavelength and $n_r$ is the refractive index of the medium. The paired layers having different composition ratios are alternately laminated to a thickness of 35.5 periods. The carrier concentration for dopant of silicon is $2 \times 10^{18}$ cm$^{-3}$. The upper DBR layer 9 is composed of a p-type $Al_{0.9}Ga_{0.1}As$ layer and a p-type $Al_{0.15}Ga_{0.85}As$ layer. Each layer is $\lambda/4n_r$ thick where $\lambda$ is the oscillation wavelength and $n_r$ is the refractive index of the medium. The paired layers having different composition ratios are alternately laminated to a thickness of 23 periods. The carrier concentration for dopant of carbon is $2 \times 10^{18}$ cm$^{-3}$.

The lowermost layer of the upper DBR layer 9 is formed by the p-type AlAs layer 8 instead of the p-type $Al_{0.9}Ga_{0.1}As$ layer. The AlAs layer 8 is $\lambda/4n_r$ thick where $\lambda$ is the oscillation wavelength and $n_r$ is the refractive index of the medium. The carrier concentration of the AlAs layer 8 for dopant of carbon is $2 \times 10^{18}$ cm$^{-3}$. A transition layer having a medium aluminum composition ratio may be provided between the $Al_{0.9}Ga_{0.1}As$ layer and the $Al_{0.15}Ga_{0.85}As$ layer in the lower DBR layer 3 and/or the upper DBR layer 8 to reduce series resistance in the device. The p-type GaAs contact layer 10 is 20 nm thick and has a carrier concentration of $1 \times 10^{20}$ cm$^{-3}$.

B: Forming p-side Contact Electrode

Figure 2B:
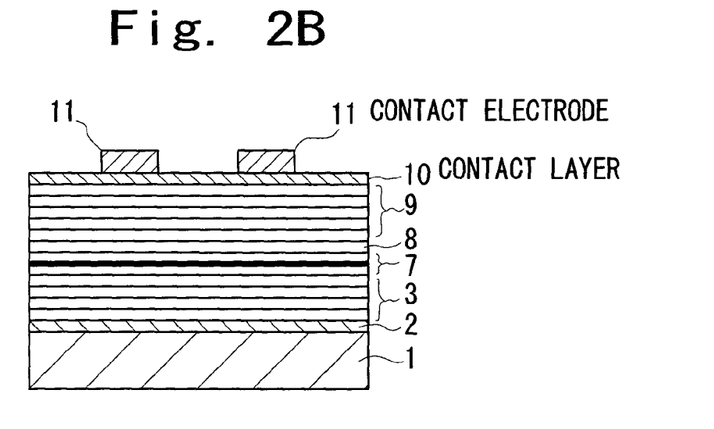

As shown in FIG. 2B, resist is deposited and is photolithographically patterned on the laminate epitaxially grown on the substrate 1, and a material for the p-side contact electrode 11 is deposited. Then, the material and the resist are moved together by the lift-off process, so that the p-side contract electrode 11 can be formed. The p-side contact electrode 11 has a ring shape and the inside diameter thereof defines the outgoing light window 11a. The p-side contact electrode 11 may be formed by at least one of metal materials such as Au, Pt, Ti, Ge, Zn, Ni, In, W and ITO.

C: Deposition of Outgoing Light Window Protection Film

Figure 2C:
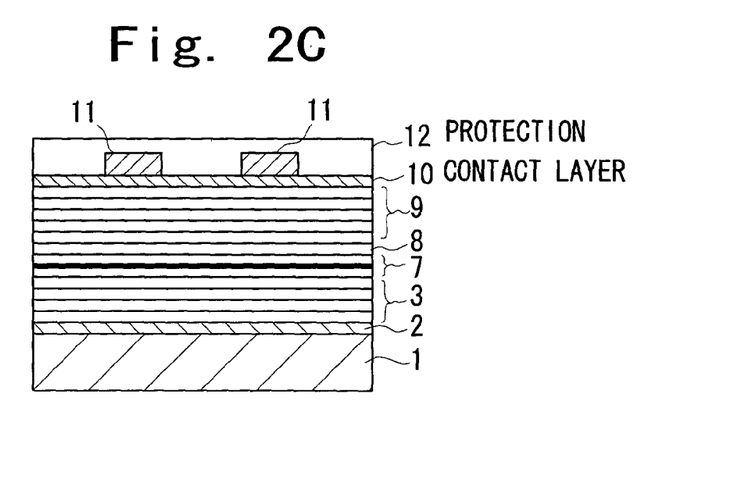

As shown in FIG. 2C, the outgoing light window protection film 12 is formed on the contact layer 10 including the p-side contact electrode 11 by PCVD. For example, the outgoing light window protection film 12 of silicon oxynitride may be deposited to 250 nm under the following condition:

Substrate temperature: 250° C.;
Source gas: monosilane 25 ccm, dinitrogen monoxide 200 ccm, nitrogen 100 ccm;
RF power: 200 W
Pressure: 26.6 Pa.

D: Patterning Outgoing Light Protection Window Film

Figure 2D:
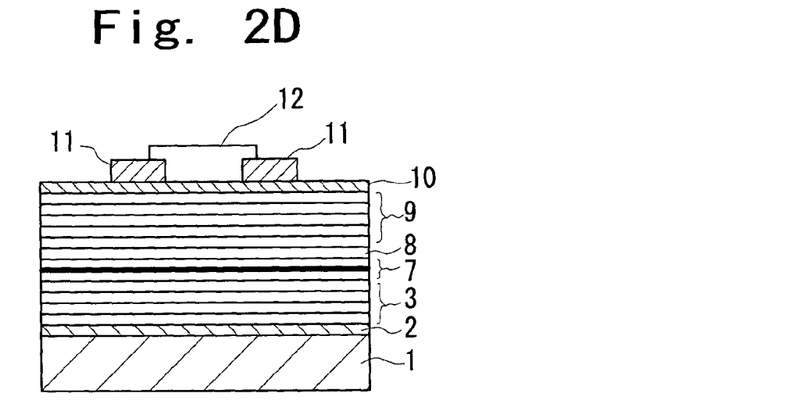

As shown in FIG. 2D, resist is deposited and is photolithographically patterned so that a portion of the outgoing light window protection film 12 that is not covered by the resist can be removed. Then, the resist is removed, so that the patterned protection film for protecting the outgoing light window can be formed on the contact electrode 11.

E: Deposition of Mask for Forming Mesa

Figure 2E:
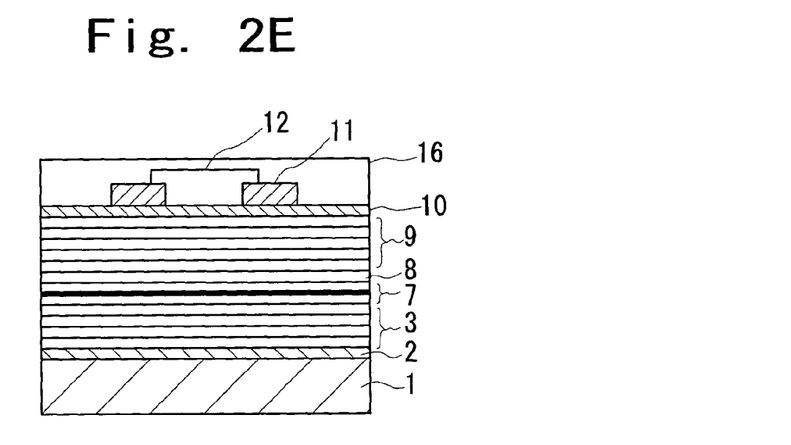

As shown in FIG. 2E, a silicon nitride film as a mask 16 for forming the mesa is deposited to 820 nm on the contact layer 10 including the contact electrode 11 and the outgoing light window protection film 12 by PCVD under the following condition:

Substrate temperature: 300° C.;
Source gas: monosilane 35 ccm, ammonia 105 ccm, hydrogen 175 ccm, nitrogen 175 ccm;
RF power: 800 W
Pressure: 56.5 Pa.

F: Patterning Mask for Forming Mesa

Figure 2F:
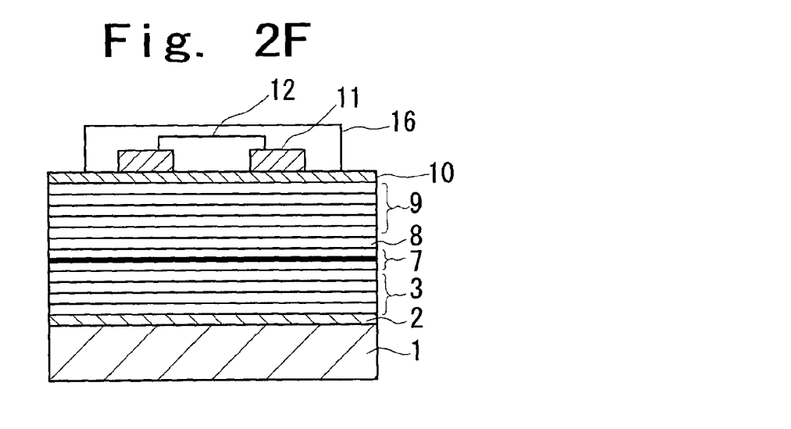

As shown in FIG. 2F, resist is deposited and is photolithography patterned. Then, a portion of the mask 16 for forming the mesa that is not covered by the resist is removed, so that the mask 16 can be formed into a predetermined shape.

G: Forming Mesa

Figure 2G:
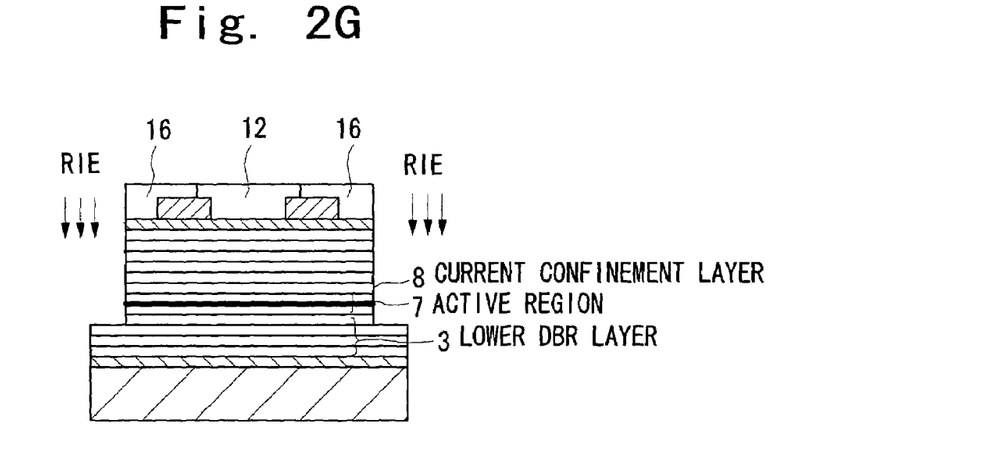

As shown in FIG. 2G, the laminate is etched with the mask 16 being used as a mask for etching until the lower DBR layer 3 is partially exposed by reactive ion etching (RIE) using boron trichloride and chlorine.

H: Forming Selective Oxidization Region

Figure 2H:
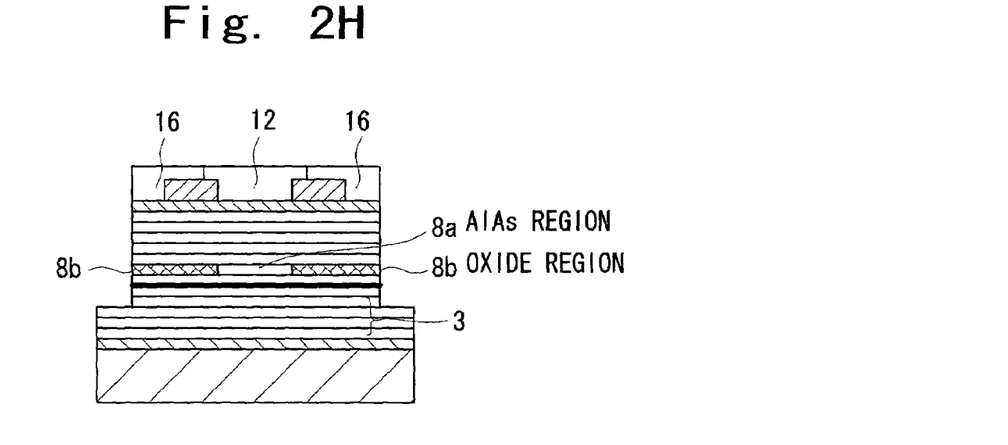

As shown in FIG. 2H, the AlAs layer 8 is heated at 360° C. using a wet oxidization furnace into which a water vapor is introduced. This selectively partially oxidizes the AlAs layer 8 from the side surface of the mesa structure and results in the oxide region 8b.

I: Forming Interlayer Insulation Film

Figure 2I:
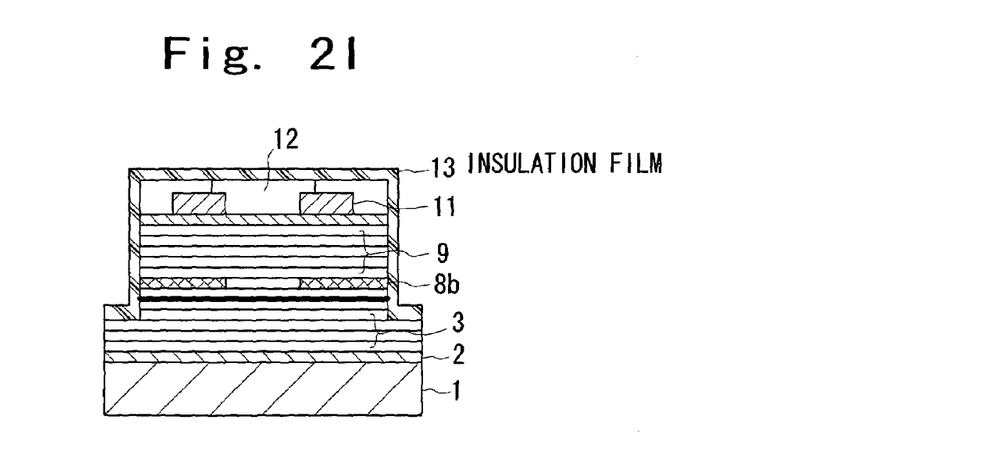

As shown in FIG. 2I, the interlayer insulation film 13 is formed so as to cover the top surface, side surface and bottom of the mesa structure. In the present embodiment, in order to reduce the internal stress in the interlayer insulation film 13, a silicon nitride film is deposited to 800 nm by PCVD under the following condition:

| Condition | Quantity | Unit |
|---|---|---|
| monosilane | 35 | ccm |
| ammonia | 105 | ccm |
| hydrogen | 175 | ccm |
| nitrogen | 175 | ccm |
| RF power | 800 | W |
| substrate temperature | 300 | ° C. |
| pressure | 56.6 | Pa |

(The heater temperature by PCVD is approximately 400° C. for a substrate temperature of 300° C.)

The silicon nitride film 13 thus formed has an internal stress of $3 \times 10^8$ dyne/cm$^2$, which is approximately a one-digit reduction as compared to the conventional silicon nitride film that has an internal stress of $3 \times 10^9$ dyne/cm$^2$. This effect can be brought about by including hydrogen and nitrogen in the source gas so that excessive hydrogen and nitrogen come to be mixed in the silicon nitride film.

Figure 3:
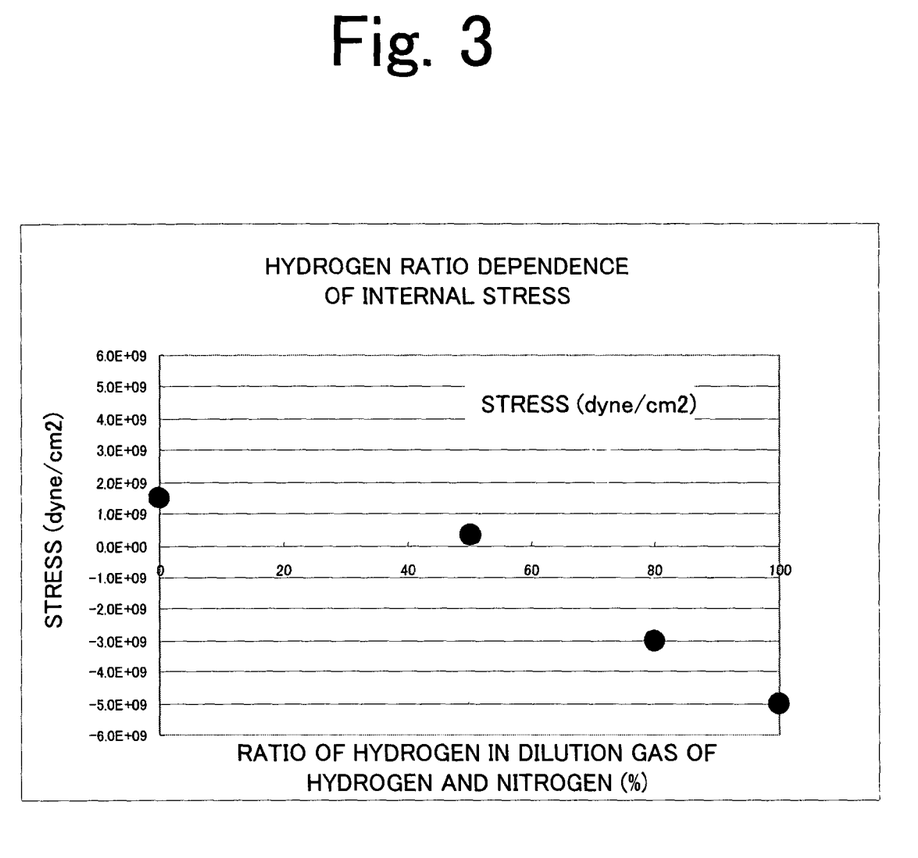
FIG. 3 is a graph of a relationship between the ratio of hydrogen in a dilution gas of hydrogen and nitrogen and internal stress.

The inventors found that the internal stress can be controlled to a desired level by changing the ratio of a dilution gas of hydrogen and nitrogen included in the source gas. FIG. 3 is a graph of a relationship between internal stress and the ratio of hydrogen and nitrogen. More particularly, the horizontal axis of the graph denotes the ratio of hydrogen included in the dilution gas including hydrogen and nitrogen, and the vertical axis thereof denotes internal stress. In the vertical axis, "0.0E+00" denotes an internal stress of zero. The internal stress is tensile stress when it has a positive value, and is compressive stress when it has a negative value. When the ratio of hydrogen contained in the dilution gas is 50%, the silicon nitride film has an internal stress as small as $3 \times 10^8$ dyne/cm$^2$. As the ratio of hydrogen contained in the dilution gas increases, the internal stress is changed to compressive stress, which increases. For example, when the ratio of hydrogen reaches 80%, a compressive stress of $3 \times 10^9$ dyne/cm$^2$ appears. In contrast, as the ratio of hydrogen decreases, the internal stress is increasing tensile stress.

J: Forming Contact Region

Figure 2J:
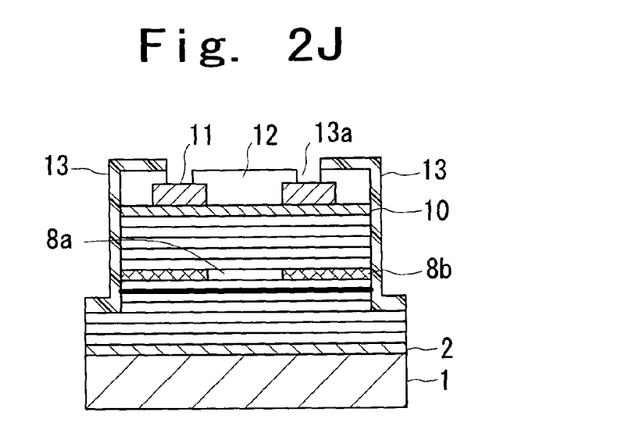

As shown in FIG. 2J, resist is deposited and is photolithographically patterned. Then, the interlayer insulation film 13 is removed by dry etching with a source gas of $SF_6+O_2$ that has selectivity in etching, so that the entire surface of the outgoing light window protection film 12 can be exposed and part of the mask 16 for forming the mesa can be removed. This results in the contact hole 13a. Thereafter, the resist is removed.

K: Forming Wiring Electrode

Figure 2K:
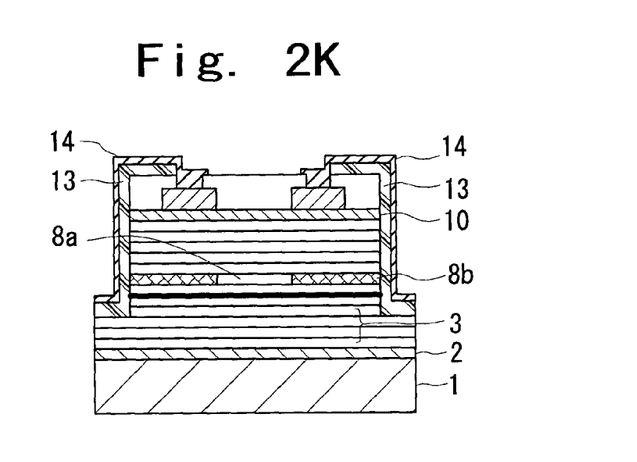

As shown in FIG. 2K, resist is deposited and is photolithographically patterned. Next, a material for the wiring electrode, such as a metal laminate of Ti/Au, is deposited, and is then subjected to lift-off. This results in the wiring electrode 14 in a given position. The wiring electrode 14 has a window greater than the outgoing light window 11a defined by the contact electrode 11, and is connected to the contact electrode 11 via the contact hole 13a.

L: Polishing Backside of Substrate

The backside of the n-type GaAs substrate 1 is polished by a polishing machine until the substrate 1 becomes 200 μm thick.

M: Forming n-side Electrode

Figure 2L:
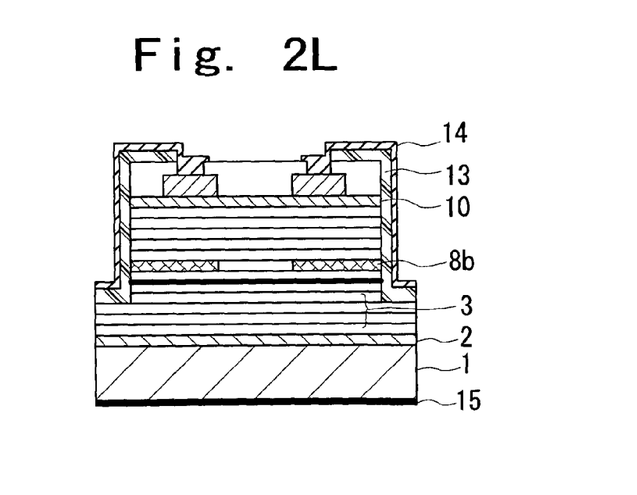

As shown in FIG. 2L, a material for the n-side electrode 15 is deposited on the back surface of the n-type GaAs substrate 1. The n-side electrode 15 may be a laminate of Au/Ge/Ni/Au.

Second Embodiment

A description will now be given of a second embodiment of the present invention. A surface emitting semiconductor laser according to the present embodiment differs from the first embodiment in that the second embodiment has a different structure of the interlayer insulation film and the interlayer insulation film remains on the outgoing light window protection film. Further, the silicon nitride film as the mask is used in the depositing process of the mask for forming the mesa (the process of FIG. 2E) in the first embodiment, while the silicon oxynitride film for the mask is deposited in the second embodiment. The other structures and processes of the second embodiment are the same as those of the first embodiment.

In the step of FIG. 2I according to the second embodiment of the present invention, the interlayer insulation film 13 is formed in a region including the mesa and the mesa bottom. For example, the interlayer insulation film 13 may be deposited to 800 nm by PCVD under the following condition:

| Condition | Quantity | Unit |
|---|---|---|
| monosilane | 25 | ccm |
| dinitrogen monoxide | 200 | ccm |
| nitrogen | 100 | ccm |
| RF power | 200 | W |
| substrate temperature | 250 | ° C. |
| pressure | 26.6 | Pa |

(The heater temperature by PCVD is approximately 340° C. for a substrate temperature of 250° C.)

The silicon oxynitride film 13 thus formed has an internal stress of $3 \times 10^8$ dyne/cm$^2$ that is compressive stress.

After the silicon oxynitride film is formed, resist is deposited and is photolithographically patterned. Then, the inorganic insulation film that is a part of the p-type contact electrode 11 (silicon oxynitride of the mask film 16 for forming the mesa and the interlayer insulation film 13) is removed by dry etching with a source gas of CHF$_3$+O$_2$. This results in the contact hole 13a in a state in which the interlayer insulation film 13 on the outgoing light window film 12 partially remains.

Third Embodiment

A description will now be given of a third embodiment of the present invention. A surface emitting semiconductor laser according to the third embodiment of the invention differs from that of the first embodiment in the structure of the interlayer insulation film.

In the step of FIG. 2I according to the third embodiment of the present invention, multiple silicon nitride films having tensile stress and compressive stress are laminated to form the interlayer insulation film.

A silicon nitride film having tensile stress is deposited to 400 nm under the following condition:

| Condition | Quantity | Unit |
|---|---|---|
| monosilane | 35 | ccm |
| ammonia | 240 | ccm |
| hydrogen | 0 | ccm |
| nitrogen | 0 | ccm |
| RF power | 100 | W |
| substrate temperature | 250 | ° C. |
| pressure | 26.6 | Pa |

The tensile stress of the silicon nitride film thus formed is $3 \times 10^9$ dyne/cm$^2$.

A silicon nitride film having compressive stress is deposited to 400 nm under the following condition:

| Condition | Quantity | Unit |
|---|---|---|
| monosilane | 35 | ccm |
| ammonia | 105 | ccm |
| hydrogen | 280 | ccm |
| nitrogen | 70 | ccm |
| RF power | 800 | W |
| substrate temperature | 300 | ° C. |
| pressure | 73.2 | Pa |

The tensile stress of the silicon nitride film thus formed is $3 \times 10^9$ dyne/cm$^2$.

By alternately laminating one or more films having tensile stress and one or more films having compressive stress, the stress of the entire insulation film can be reduced as large as possible, and the mechanical strength of the interlayer insulation film can be improved. By adjusting the ratio of hydrogen contained in the dilution gas, the values of the compressive stress and tensile stress can be changed.

After the interlayer insulation film is formed, the resist is deposited and is photolithographically patterned. Then, the inorganic interlayer insulation film 13 on all the outgoing light window protection film 12 and a part of the p-type contact electrode 11 (the silicon nitride film of the mask 16 for forming the mesa and the interlayer insulation film 13) is removed by dry etching with a source gas of SF$_6$+O$_2$ that has selectivity in etching. Thereafter, the resist is removed.

Figure 4:
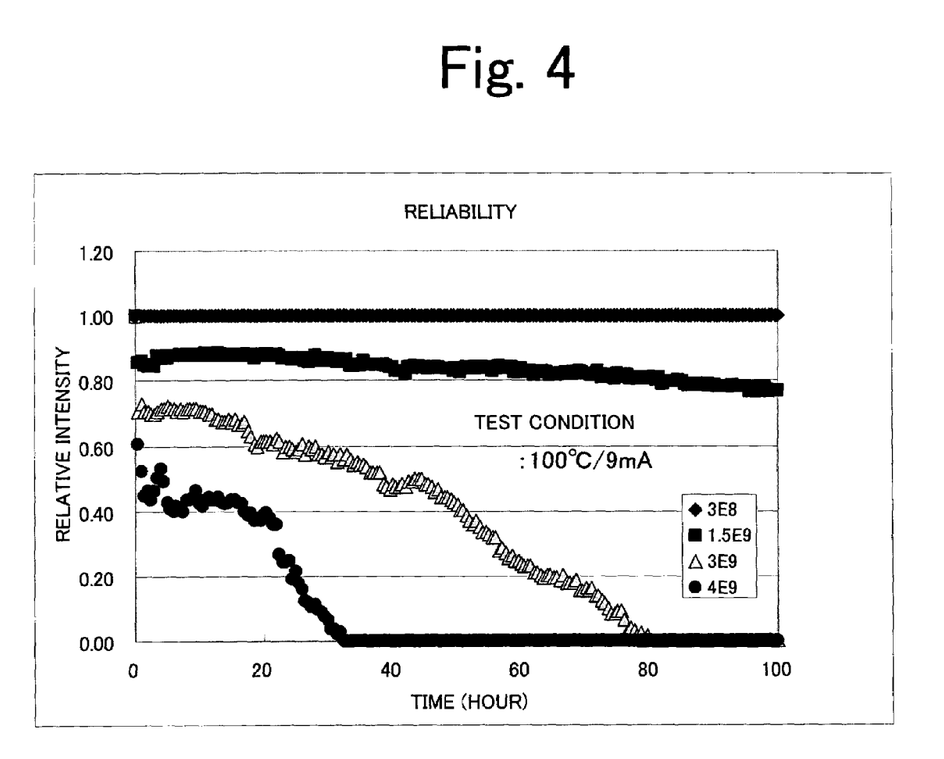
FIG. 4 is a graph of a relationship between internal stress in an interlayer insulation film and reliability obtained by an acceleration aging test.

FIG. 4 shows reliability of the surface emitting semiconductor laser. The graph shows a time variation of the surface emitting semiconductor laser in an acceleration aging test in which a current of 9 mA is caused to flow in the laser at a temperature of 100° C. The horizontal axis of the graph of FIG. 4 denotes time, and the vertical axis thereof denotes the relative intensity of the mesa structure. The relative intensity shows a relative change of the laser light output power emitted from the mesa. For a relative intensity of "1 (100%)", the laser light output does not have any change. As the relative intensity decreases, the laser light output decreases. In the graph, solid circular dots are plotted when the internal stress of the interlayer insulation film is $4 \times 10^9$ dyne/cm$^2$. Blank triangular dots are plotted for an internal stress of the interlayer insulation film of $3 \times 10^9$ dyne/cm$^2$. Solid square dots are plotted for an internal stress of the interlayer insulation film of $1.5 \times 10^9$ dyne/cm$^2$. Solid diamond dots are plotted for an internal stress of the interlayer insulation film of $3 \times 10^8$ dyne/cm$^2$. As can be seen from FIG. 4, when the internal stress exceeds $1.5 \times 10^9$ dyne/cm$^2$ (solid circular dots and blank triangular dots), the relative intensity decreases significantly and the reliability of the surface emitting semiconductor laser deteriorates considerably.

When the internal stress is lower than $1.5 \times 10^9$ dyne/cm$^2$, the relative intensity does not degrade very much, and the reliability of the surface emitting semiconductor laser maintains.

A description will now be given of a method of measuring stress in the interlayer insulation film. The stress in the interlayer insulation film can be measured by using the Newton's rings method. A flatness tester is used and the circular substrate is placed on a plane that is optically smooth. Light is vertically projected onto the optically flat plane. Then, the Newton's rings caused due to interference between the substrate surface and the optically flat plane are measured. The degree of bending of the substrate is obtained from the Newton's rings, and the internal stress is obtained from the degree of bending.

More particularly, a measurement-use substrate is prepared separate from the substrate on which the surface emitting semiconductor lasers are formed. The degree (h1) of bending of the measurement-use substrate is measured from the Newton's rings. Next, the substrate for the laser devices and the measurement-use substrate are placed in the same environment. Then, the interlayer insulation film is formed on the mesa structures of the substrate for the laser devices (at the step of FIG. 2I), while an interlayer insulation film is simultaneously formed on the measurement-use substrate under the same condition. Thereafter, the measurement-use substrate on which the interlayer insulation film has been formed is subjected to the Newton's ring measurement again, so that the degree (h2) of bending thereof is measured.

Internal stress $\sigma$ can be obtained by using the degrees (h1) and (h2) of bending and the following expression:

$$\sigma = (E \cdot d^2 \cdot \Delta h)/(3 \cdot (1-\nu) \cdot r^2 \cdot d)$$

where:
$\sigma$: internal stress
E: Young's modulus of the substrate
d: thickness of the substrate
$\Delta h$: variation in the degree of bending of the substrate caused by depositing the interlayer insulation film
$\nu$: Poisson's ratio
r: radius of the substrate
d: thickness of the interlayer insulation film As has been described, according to the embodiments of the present invention, the interlayer insulation film that covers the mesa structure of the surface emitting semiconductor laser has reduced internal stress, so that the mechanical strength of the mesa structure can be maintained and prevented from caving in. This lengthens the lifetime of the laser devices and improves the reliability thereof.

In the foregoing, some preferable embodiments of the present invention have been described in detail. It is to be noted that the present invention is not limited to these embodiments, but includes various variations and modifications. For instance, the semiconductor substrate may be another substrate or an insulation substrate. When the insulation substrate is used, the n-side electrode electrically makes contact with a part of the lower DBR layer of n type laminated on the substrate. The current confinement layer is not limited to the AlAs layer but may be an AlGaAs layer. The DBR layers, the contact layers and metal wiring patterns may be made of materials other than those that have been mentioned previously. The mesa structure is not limited to the cylindrical shape but may have a rectangular shape or ellipsoidal shape. The outgoing light window and the contact electrode are not limited to the circular shapes, but may have an oval, rectangular or square shape.

According to the present invention, at least the side surface of the mesa structure of the surface emitting semiconductor laser is coated with the inorganic insulation film that has an internal stress of $1.5 \times 10^9$ dyne/cm$^2$ or less. With the above structure, it is possible to reduce strain in the inorganic insulation film and to prevent the mechanical strength of the inorganic insulation film from deteriorating in a short period of time. It is therefore possible to have preventive measures for degradation, deformation or deterioration of the mesa structure and to stabilize the laser emitted from the mesa structure over a long period. Thus, the reliability of the surface emitting semiconductor laser can be greatly improved.

Preferably, the inorganic insulation film that covers at least the side surface of the mesa structure has a multilayer structure that has an insulation film having tensile stress and another insulation film having compressive stress. It is therefore possible to reduce the internal stress of the entire inorganic insulation film and to thus maintain the mechanical strength of the inorganic insulation film and operate the mesa structure stably.

Finally, the present invention is summarized from various viewpoints.

The surface emitting semiconductor laser includes a substrate; a first mirror that is formed on the substrate and includes semiconductor layers of a first conduction type; a second mirror that includes semiconductor layers of a second conduction type; an active region disposed between the first and second mirrors; a current confinement layer that is disposed between the first and second mirrors and includes a selectively oxidized region; and an inorganic insulation film, a mesa structure including at least the second mirror and the current confinement layer, the inorganic insulation film covering at least a side surface of the mesa structure and having an internal stress equal to or less than $1.5 \times 10^9$ dyne/cm$^2$.

The surface emitting semiconductor laser includes: a substrate; a first semiconductor laminate of distributed a feedback type formed on a first main surface of the substrate, the first semiconductor laminate having a first conduction type; an active region formed on the first semiconductor laminate; a second semiconductor laminate of distributed feedback type formed on the active region, the second semiconductor laminate having a second conduction type; a current control layer that includes at least one $Al_xGa_{1-x}As$ ($0.9 \leq x \leq 1$) having a partially oxidized region and is interposed between the first and second semiconductor laminates; and an inorganic insulation film, a mesa structure ranging at least from an upper portion of the second semiconductor multilayer to the current control layer, the inorganic insulation film covering at least an upper surface and side surface of the mesa structure and having an internal stress equal to or less than $1.5 \times 10^9$ dyne/cm$^2$.

With the above structures, the inorganic insulation film has a smaller internal stress than that of the conventional structure. It is therefore possible to reduce strain caused in the inorganic insulation film and prevent the mechanical strength of the inorganic insulation film from deteriorating in a short period of time. It is therefore possible to have preventive measures for degradation, deformation or deterioration of the mesa structure and to stabilize the laser emitted from the mesa structure over a long period. Thus, the reliability of the surface emitting semiconductor laser can be greatly improved. Preferably, the current confinement or control layer is a semiconductor layer containing aluminum. More preferably, the Al composition ratio x of the current confinement or control layer is equal to or greater than 0.95, and $Al_{0.95}Ga_{0.05}As$ may be used. The Al composition ratio x may be equal to 1 (AlAs layer).

Preferably, the inorganic insulation film may be made of silicon oxide, silicon nitride and/or silicon oxynitride and may be formed by plasma-assisted chemical vapor deposition. Preferably, the silicon nitride film is a film formed by monosilane and ammonia mixed with a dilution gas of hydrogen or nitrogen, and a ratio of hydrogen in the dilution gas is approximately 50%. By adding a dilution gas of hydrogen or nitrogen to the source gas, it is possible to reduce internal stress and control the magnitude of internal stress by changing the ratio of hydrogen and nitrogen. When the inorganic insulation film is made of silicon oxynitride, it is preferable to mix a gas of monosilane with a gas of dinitrogen monoxide and nitrogen.

More preferably, the inorganic insulation film has an internal stress equal to or less than $3\times10^8$ dnye/cm$^2$. It has been confirmed that the lifetime of the mesa structure can be lengthened from the results of acceleration aging test. The internal stress in the inorganic insulation film may be measured using Newton's rings.

The surface emitting semiconductor laser includes: a substrate; a first mirror including a first conduction type semiconductor layer formed on the substrate; a second mirror including a second conduction type semiconductor layer; an active region interposed between the first and second mirrors; a current confinement portion that includes a selectively oxidized region and is interposed between the first and second mirrors; and an inorganic insulation film, a mesa structure including at least the second mirror and the current confinement portion, the inorganic insulation film covering at least a side surface of the mesa structure and including a laminate of a first insulation film having tensile stress and a second insulation film having compressive stress.

The surface emitting semiconductor laser includes: a substrate; a first semiconductor laminate of distributed a feedback type formed on a first main surface of the substrate, the first semiconductor laminate having a first conduction type; an active region formed on the first semiconductor laminate; a second semiconductor laminate of distributed feedback type formed on the active region, the second semiconductor laminate having a second conduction type; a current control layer that includes at least one $Al_xGa_{1-x}As$ ($0.9 \leq x \leq 1$) having a partially oxidized region and is interposed between the first and second semiconductor laminates; and an inorganic insulation film, a mesa structure ranging at least from an upper portion of the second semiconductor multilayer to the current control layer, the inorganic insulation film covering at least an upper surface and side surface of the mesa structure and having a laminate of a first insulation layer having tensile stress and a second insulation film having compressive stress.

The inorganic insulation film includes two different types of layers, namely, a layer having tensile stress and another layer having compressive stress. It is therefore possible to reduce internal stress of the entire inorganic insulation film and to maintain the mechanical strength of the inorganic insulation film and operate it stably.

The layer having tensile stress and the layer having compressive stress are alternately laminated so as to form a pair. The inorganic insulation film may be made of silicon oxide, silicon nitride and/or silicon oxynitride. Preferably, the inorganic insulation film is formed by PCVD.

Preferably, the first insulation layer having tensile stress has a smaller amount of hydrogen than that of the second insulation layer having compressive stress. By adjusting the amount of hydrogen contained in the inorganic silicon nitride film, it is possible to control the magnitude of internal stress. If the inorganic insulation film contains a large amount of hydrogen, compressive stress becomes available. Preferably, the second insulation film may be formed using a source gas of monosilane and ammonia mixed with a dilution gas of hydrogen and nitrogen, wherein the ratio of hydrogen contained in the dilution gas exceeds 60%.

What is claimed is:

1. A surface emitting semiconductor laser comprising:
a substrate;
a first mirror that is formed on the substrate and includes semiconductor layers of a first conduction type;
a second mirror that includes semiconductor layers of a second conduction type;
an active region disposed between the first and second mirrors;
a current confinement layer that is disposed between the first and second mirrors and includes a selectively oxidized region; and
an inorganic insulation film,
a mesa structure including at least the second mirror and the current confinement layer,
the inorganic insulation film covering at least a side surface of the mesa structure and having an internal stress controlled by a source gas mixed with a dilution gas and equal to or less than $1.5\times10^9$ dyne/cm$^2$.

2. The surface emitting semiconductor laser as claimed in claim 1, wherein the inorganic insulation film comprises silicon oxide, silicon nitride and/or silicon oxynitride.

3. The surface emitting semiconductor laser as claimed in claim 2, wherein the silicon nitride film is a film formed by monosilane and ammonia mixed with the dilution gas containing hydrogen or nitrogen, and a ratio of hydrogen in the dilution gas is approximately 50%.

4. The surface emitting semiconductor laser as claimed in claim 2, wherein silicon oxynitride is formed by monosilane mixed with a gas of dinitrogen monoxide and nitrogen.

5. The surface emitting semiconductor laser as claimed in claim 1, wherein the internal stress of the inorganic insulation film is equal to or less than $3\times10^8$ dnye/cm$^2$.

6. The surface emitting semiconductor laser as claimed in claim 1, wherein the inorganic insulation film is a film formed by a plasma-assisted chemical vapor deposition process.

7. The surface emitting semiconductor laser as claimed in claim 1, wherein the dilution gas is at least one of a hydrogen gas and a nitrogen gas.

8. The surface emitting semiconductor laser as claimed in claim 1, wherein the inorganic insulation film has at least one film selected from the group consisting of a silicon nitride film containing hydrogen and nitrogen, a dinitrogen monoxide film and a silicon oxynitride film.

9. A surface emitting semiconductor laser comprising:
a substrate;
a first semiconductor laminate of distributed a feedback type formed on a first main surface of the substrate, the first semiconductor laminate having a first conduction type;
an active region formed on the first semiconductor laminate;
a second semiconductor laminate of distributed feedback type formed on the active region, the second semiconductor laminate having a second conduction type;

a current control layer that includes at least one $Al_xGa_{1-x}As$ ($0.9 \leq x \leq 1$) having a partially oxidized region and is interposed between the first and second semiconductor laminates; and an inorganic insulation film, a mesa structure ranging at least from an upper portion of the second semiconductor multilayer to the current control layer, the inorganic insulation film covering at least an upper surface and side surface of the mesa structure and having an internal stress controlled by a source gas mixed with a dilution gas and equal to or less than $1.5 \times 10^9$ dyne/cm$^2$.

10. The surface emitting semiconductor laser as claimed in claim 9, wherein the inorganic insulation film comprises silicon oxide, silicon nitride and/or silicon oxynitride.

11. The surface emitting semiconductor laser as claimed in claim 10, wherein silicon nitride is formed by monosilane and ammonia mixed with the dilution gas containing hydrogen or nitrogen, and a ratio of hydrogen in the dilution gas is approximately 50%.

12. The surface emitting semiconductor laser as claimed in claim 10, wherein silicon oxynitride is formed by monosilane mixed with a gas of dinitrogen monoxide and nitrogen.

13. The surface emitting semiconductor laser as claimed in claim 9, wherein the inorganic insulation film is a film formed by a plasma-assisted chemical vapor deposition process.

14. The surface emitting semiconductor laser as claimed in claim 9, wherein the internal stress of the inorganic insulation film is equal to or less than $3 \times 10^8$ dnye/cm$^2$.

15. A surface emitting semiconductor laser comprising:
a substrate;
a first mirror including a first conduction type semiconductor layer formed on the substrate;
a second mirror including a second conduction type semiconductor layer;
an active region interposed between the first and second mirrors;
a current confinement portion that includes a selectively oxidized region and is interposed between the first and second mirrors; and
an inorganic insulation film,
a mesa structure including at least the second mirror and the current confinement portion,
the inorganic insulation film covering at least a side surface of the mesa structure and including a laminate of a first insulation film having tensile stress and a second insulation film having compressive stress.

16. The surface emitting semiconductor laser as claimed in claim 15, wherein the inorganic insulation film comprises silicon oxide, silicon nitride and/or silicon oxynitride.

17. The surface emitting semiconductor laser as claimed in claim 15, wherein the first and second insulation films comprise silicon nitride.

18. The surface emitting semiconductor laser as claimed in claim 15, wherein:
the first insulation film is a first silicon nitride film;
the second insulation film is a second silicon nitride film; and
the first insulation film has a lower amount of hydrogen than that of the second insulation film.

19. The surface emitting semiconductor laser as claimed in claim 18, wherein the second silicon nitride film is formed by monosilane and ammonia mixed with a dilution gas of hydrogen and nitrogen, and a ratio of hydrogen in the dilution gas is approximately 60%.

20. A surface emitting semiconductor laser comprising:
a substrate;
a first semiconductor laminate of distributed a feedback type formed on a first main surface of the substrate, the first semiconductor laminate having a first conduction type;
an active region formed on the first semiconductor laminate;
a second semiconductor laminate of distributed feedback type formed on the active region, the second semiconductor laminate having a second conduction type;
a current control layer that includes at least one $Al_xGa_{1-x}As$ ($0.9 \leq x \leq 1$) having a partially oxidized region and is interposed between the first and second semiconductor laminates; and
an inorganic insulation film,
a mesa structure ranging at least from an upper portion of the second semiconductor multilayer to the current control layer,
the inorganic insulation film covering at least an upper surface and side surface of the mesa structure and having a laminate of a first insulation layer having tensile stress and a second insulation film having compressive stress.

21. The surface emitting semiconductor laser as claimed in claim 20, wherein the inorganic insulation film comprises silicon oxide, silicon nitride and/or silicon oxynitride.

22. The surface emitting semiconductor laser as claimed in claim 20, wherein the first and second insulation films comprise silicon nitride.

23. The surface emitting semiconductor laser as claimed in claim 20, wherein:
the first insulation film is a first silicon nitride film;
the second insulation film is a second silicon nitride film; and
the first insulation film has a lower amount of hydrogen than that of the second insulation film.

24. The surface emitting semiconductor laser as claimed in claim 23, wherein the second silicon nitride film is formed by monosilane and ammonia mixed with a dilution gas of hydrogen and nitrogen, and a ratio of hydrogen in the dilution gas is approximately 60%.

25. A method of fabricating a surface emitting semiconductor laser of selective oxidization type comprising the steps of:
forming, on a substrate, multiple layers including first and second mirrors, a current confinement layer and an active region;
forming a mesa structure ranging at least from the second mirror to the current confinement layer;
oxidizing the current confinement layer from a side surface of the mesa structure; and
forming an inorganic insulation film that covers at least a side surface of the mesa structure and an internal stress equal to or lower than $1.5 \times 10^9$ dyne/cm$^2$ with a source gas mixed with a dilution gas.

26. The method as claimed in claim 25, wherein the inorganic insulation film comprises silicon oxide, silicon nitride and/or silicon oxynitride.

27. The method as claimed in claim 25, wherein the step of forming the inorganic insulation film uses plasma-assisted chemical vapor deposition.

28. The method as claimed in claim 25, wherein the step of forming the inorganic insulation film comprises a step of forming a silicon nitride film using the source gas of monosilane and ammonia mixed with the dilution gas of hydrogen and nitrogen.

29. The method as claimed in claim 28, wherein a ratio of hydrogen contained in the dilution gas is approximately 50%.

30. The method as claimed in claim 25, wherein the inorganic insulation film comprises silicon oxynitride by using a gas of monosilane mixed with a gas of dinitrogen monoxide and nitrogen.

31. The method as claimed in claim 25, wherein the inorganic insulation film comprises a first silicon nitride having tensile stress and a second silicon nitride having compressive stress.

32. The method as claimed in claim 31, wherein the first silicon nitride contains a smaller amount of hydrogen than that of the second silicon nitride.

33. The method as claimed in claim 32, wherein the second silicon nitride is formed by a source gas of monosilane and ammonia mixed with a dilution gas of hydrogen and nitrogen, and a ratio of hydrogen in the dilution gas is equal to or more than 60%.

* * * * *